United States Patent
Hong et al.

(10) Patent No.: US 12,288,589 B2
(45) Date of Patent: Apr. 29, 2025

(54) TEST CIRCUIT AND RECEIVING CIRCUIT HAVING TEST FUNCTION

(71) Applicant: SK hynix Inc., Icheon-si (KR)

(72) Inventors: Gi Moon Hong, Icheon-si (KR); Dae Han Kwon, Icheon-si (KR)

(73) Assignee: SK hynix Inc., Icheon-si (KR)

(\*) Notice: Subject to any disclaimer, the term of this patent is extended or adjusted under 35 U.S.C. 154(b) by 173 days.

(21) Appl. No.: 18/320,667

(22) Filed: May 19, 2023

(65) Prior Publication Data
US 2024/0242773 A1    Jul. 18, 2024

(30) Foreign Application Priority Data
Jan. 18, 2023  (KR) .................. 10-2023-0007297

(51) Int. Cl.
| | |
|---|---|
| *G11C 29/12* | (2006.01) |
| *G11C 7/10* | (2006.01) |
| *G11C 7/22* | (2006.01) |
| *G11C 29/14* | (2006.01) |
| *G11C 29/18* | (2006.01) |

(52) U.S. Cl.
CPC ...... *G11C 29/12015* (2013.01); *G11C 7/1066* (2013.01); *G11C 7/222* (2013.01); *G11C 29/14* (2013.01); *G11C 29/18* (2013.01); *G11C 2029/1802* (2013.01)

(58) Field of Classification Search
CPC . G11C 29/12015; G11C 7/1006; G11C 7/222; G11C 29/14; G11C 29/18
See application file for complete search history.

(56) References Cited

U.S. PATENT DOCUMENTS

| | | | |
|---|---|---|---|
| 2010/0110811 A1* | 5/2010 | Kim ................. | G11C 7/1096 365/201 |
| 2020/0153421 A1* | 5/2020 | Seo ................... | G11C 17/16 |
| 2022/0058143 A1 | 2/2022 | Brox et al. | |

\* cited by examiner

*Primary Examiner* — Han Yang
(74) *Attorney, Agent, or Firm* — WILLIAM PARK & ASSOCIATES LTD.

(57) ABSTRACT

A test circuit may include: a plurality of replication receivers configured to generate a plurality of oscillation signal pairs in response to a plurality of oscillation enable signals; and an oscillation control circuit configured to generate the plurality of oscillation enable signals in response to a test enable signal, and to generate a detection signal in response to any one of the plurality of oscillation signal pairs.

20 Claims, 6 Drawing Sheets

TEST CIRCUIT AND RECEIVING CIRCUIT HAVING TEST FUNCTION

CROSS-REFERENCES TO RELATED APPLICATION

The present application claims priority under 35 U.S.C. § 119(a) to Korean application number 10-2023-0007297, filed on Jan. 18, 2023, in the Korean Intellectual Property Office, which is incorporated herein by reference in its entirety.

BACKGROUND

1. Technical Field

The present disclosure relates to a semiconductor circuit, and particularly, to a test circuit and a receiving circuit having a test function.

2. Related Art

A semiconductor apparatus includes a receiving circuit for receiving externally provided data. The timing for receiving the externally provided data and the level of the received data are determined by the receiving circuit. Accordingly, the semiconductor apparatus performance may be directly related to the receiving circuit performance. In order to improve the semiconductor apparatus performance, it is necessary to improve the receiving circuit performance. Since the receiving circuit performance is significantly affected by PVT (process, voltage, temperature) variations, it is necessary to accurately detect receiving circuit operating characteristics according to the PVT variations and correct or adjust receiving circuit operating characteristics to match the detection results.

SUMMARY

Various embodiments are directed to providing a test circuit capable of accurately detecting operating characteristics of a receiving circuit, and directed to a receiving circuit having a test function.

A test circuit in accordance with an embodiment of the present disclosure may include: a plurality of replication receivers configured to generate a plurality of oscillation signal pairs in response to a plurality of oscillation enable signals; and an oscillation control circuit configured to generate the plurality of oscillation enable signals in response to a test enable signal, and to generate a detection signal in response to any one of the plurality of oscillation signal pairs.

A receiving circuit in accordance with an embodiment of the present disclosure may include: a plurality of receivers configured to receive data in response to multiphase clock signals; and a test circuit including a plurality of replication receivers having circuit configurations replicating the plurality of receivers and configured to generate a plurality of oscillation signals in response to a plurality of oscillation enable signals, and configured to generate the plurality of enable oscillation signals in response to a test enable signal and to generate a detection signal in response to any one of the plurality of oscillation signals.

A receiving circuit in accordance with an embodiment of the present disclosure may include: a plurality of receivers configured to generate a plurality of output signals by amplifying a level difference between a first input terminal and a second input terminal at timings matching inputs of clock terminals of the plurality of receivers; a mode control circuit configured to selectively provide the clock terminals of the plurality of receivers with multiphase clock signals and a plurality of oscillation enable signals in response to a test enable signal; and an oscillation control circuit configured to generate the plurality of oscillation enable signals in response to the test enable signal and the plurality of output signals, and to generate a detection signal in response to any one of the plurality of output signals.

DETAILED DESCRIPTION

Hereinafter, embodiments of the present disclosure are described in more detail with reference to the accompanying drawings.

Figure 1:
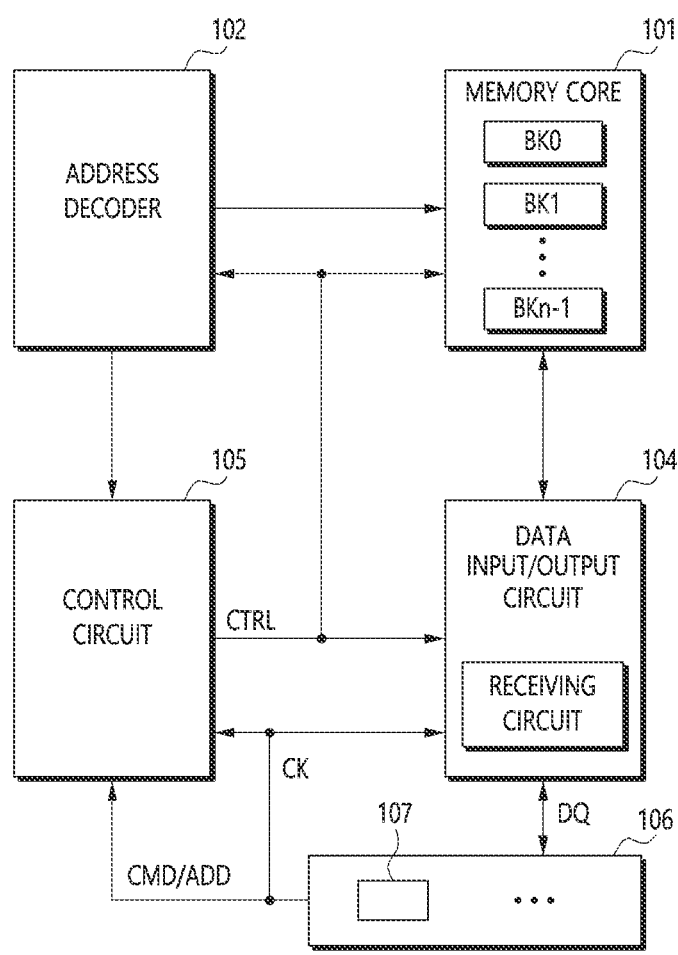
FIG. 1 is a diagram illustrating the configuration of a semiconductor apparatus in accordance with an embodiment of the present disclosure.

FIG. 1 is a diagram illustrating the configuration of a semiconductor apparatus 100 in accordance with an embodiment of the present disclosure.

Referring to FIG. 1, the semiconductor apparatus 100 in accordance with an embodiment of the present disclosure may include a memory core 101, an address decoder 102, a data input/output circuit 104, a control circuit 105, and an input/output pad unit 106.

The memory core 101 may include a plurality of unit cells, and each of the plurality of unit cells may be configured as at least one of a volatile memory and a nonvolatile memory. Examples of the volatile memory may include a static RAM (SRAM), a dynamic RAM (DRAM), and a synchronous DRAM (SDRAM), and examples of the non-volatile memory may include a read only memory (ROM), a programmable ROM (PROM), and an electrically erasable and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM), and the like. Unit cells of the memory core 101 may be divided into a plurality of unit memory areas, for example, a plurality of memory banks BK0 to BKn−1 (hereinafter, referred to as banks).

The address decoder 102 may be connected to the control circuit 105 and the memory core 101. The address decoder 102 may decode an address signal provided by the control circuit 105 and access the memory core 101 in response to the decoding result.

The control circuit 105 may be connected to the memory core 101, the address decoder 102, and the data input/output circuit 104. The control circuit 105 may receive a command CMD, an address ADD, a clock signal CK, and the like. The control circuit 105 may provide the data input/output circuit 104 with an address decoded through the address decoder 102. The control circuit 105 may control a test operation and a normal operation of the semiconductor apparatus 100. The normal operation may include a read operation, a write operation, and an address processing operation. The control circuit 105 may control data exchange between the plurality of banks BK0 to BKn−1 and the data input/output circuit 104 in response to a transpose matrix operation command, thereby controlling a transpose matrix operation. The control circuit 105 may include an algorithm for performing a transpose matrix operation in software or/and hardware form. The control circuit 105 may generate a plurality of control signals CTRL for controlling the test operation, the normal operation, and the transpose matrix operation of the semiconductor apparatus 100.

The input/output pad unit 106 may include a plurality of pads 107 for receiving the command CMD, the address ADD, the clock signal CK and inputting/outputting data DQ.

The data input/output circuit 104 may be connected to the memory core 101. The data input/output circuit 104 may exchange data with an external system or the memory core 101. The data input/output circuit 104 may include a receiving circuit 110, shown in FIG. 2, which receives data provided from outside the semiconductor apparatus 100.

Figure 2:
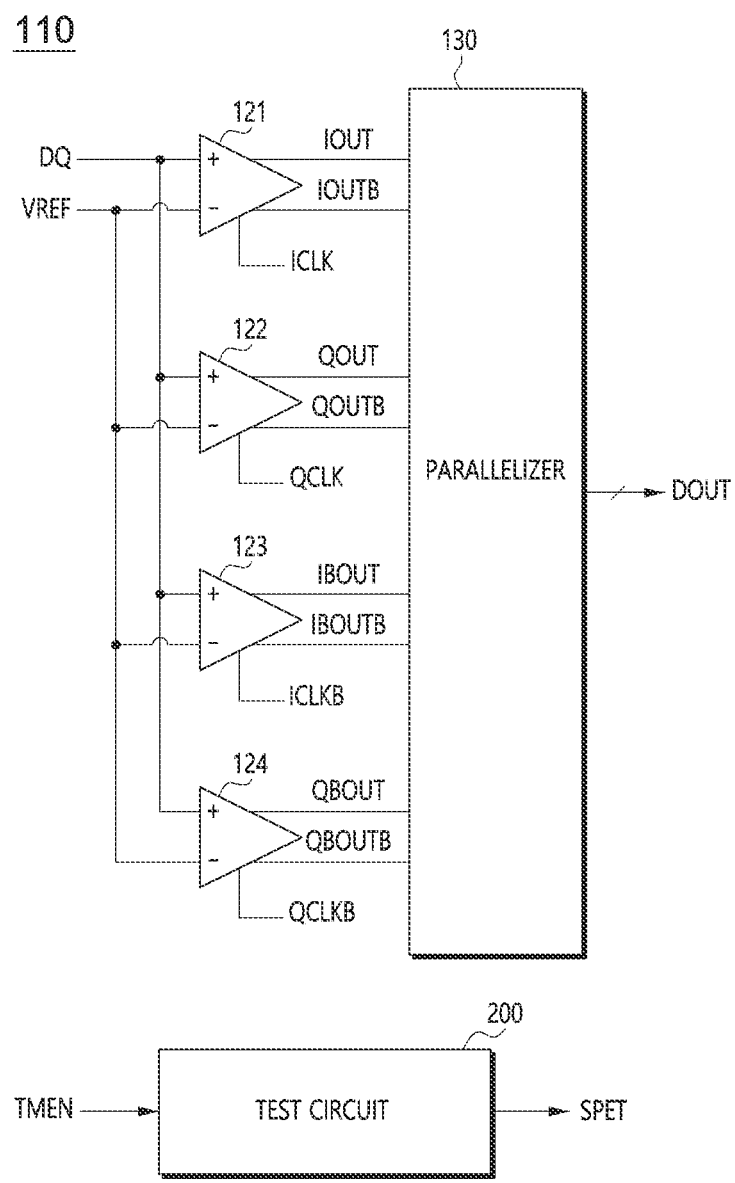
FIG. 2 is a diagram illustrating the configuration of a receiving circuit in accordance with an embodiment of the present disclosure.
Figure 3:
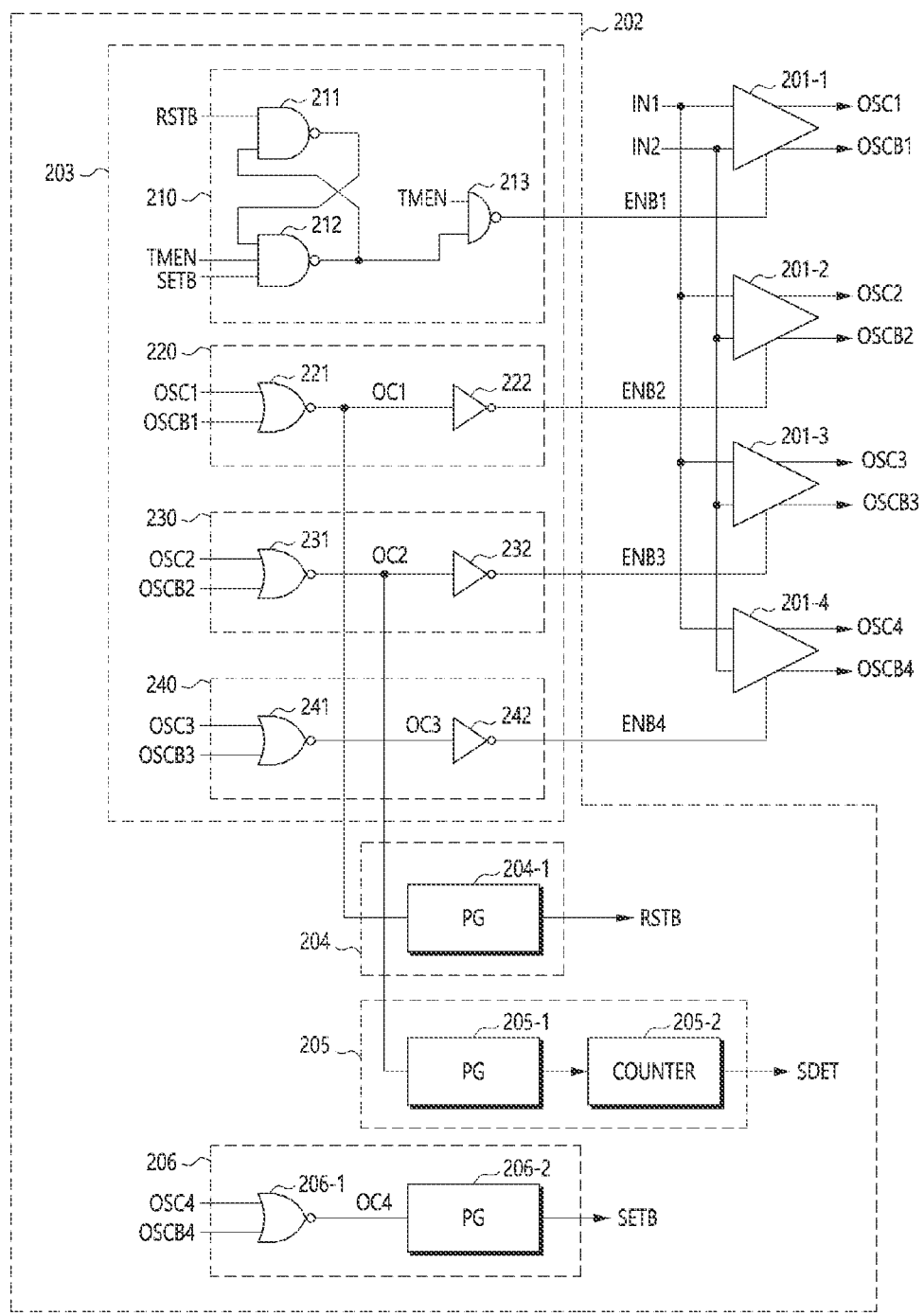
FIG. 3 is a diagram illustrating the configuration of a test circuit in accordance with an embodiment of the present disclosure.

As shown in FIG. 2, the receiving circuit 110 may include a plurality of receivers 121, 122, 123 and 124, each of which is configured to receive data in response to corresponding clock signals (multiphase clock signals) and a plurality of replication receivers having circuit configurations replicating the plurality of receivers 201-1, 201-2, 201-3 and 201-4, shown in FIG. 3, each of which is configured to generate as an output, a corresponding oscillation signal, in response to a corresponding oscillation enable provided to each replicating receiver. and may be configured to generate a plurality of oscillation enable signals in response to a test enable signal and to generate a detection signal in response to any one of the plurality of oscillation signals.

The receiving circuit 110 may include a plurality of receivers configured to generate a plurality of output signals by amplifying a level difference between a first input terminal and a second input terminal at timings matching inputs of clock terminals thereof. The receiving circuit 110 may selectively provide multiphase clock signals and a plurality of oscillation enable signals to the clock terminals of the plurality of receivers in response to a test enable signal, generate a plurality of oscillation enable signals in response to the test enable signal and the plurality of output signals, and generate a detection signal in response to any one of the plurality of output signals. The plurality of receivers may be configured to output a plurality of data signals as the plurality of output signals in response to the multiphase clock signals during the normal operation, and to output a plurality of oscillation signals as the plurality of output signals in response to the plurality of oscillation enable signals during the test operation.

FIG. 2 is a diagram illustrating the configuration of a receiving circuit 110 in accordance with an embodiment of the present disclosure.

Referring to FIG. 2, the receiving circuit 110 in accordance with an embodiment of the present disclosure may include a plurality of receivers 121 to 124, a deserializer 130, and a test circuit 200.

The plurality of receivers 121 to 124 may be activated during normal operation of the semiconductor apparatus 100. The plurality of receivers 121 to 124 may be configured to receive data DQ in response to multiphase clock signals ICLK, QCLK, ICLKB, and QCLKB provided to corresponding receivers 121 to 124. As shown in FIG. 2, a first receiver 121 may receive a first clock signal ICLK, the data DQ, and a reference voltage VREF and output first data signals IOUT and IOUTB. The first receiver 121 may output a result of comparing the data DQ with the reference voltage VREF as the first data signals IOUT and IOUTB at the transition timing of the first clock signal ICLK. A second receiver 122 may receive a second clock signal QCLK, the data DQ, and the reference voltage VREF and output second data signals QOUT and QOUTB. The second receiver 122 may output a result of comparing the data DQ with the reference voltage VREF as the second data signals QOUT and QOUTB at the transition timing of the second clock signal QCLK. A third receiver 123 may receive a third clock signal ICLKB, the data DQ, and the reference voltage VREF and output third data signals IBOUT and IBOUTB. The third receiver 123 may output a result of comparing the data DQ with the reference voltage VREF as the third data signals IBOUT and IBOUTB at the transition timing of the third clock signal ICLKB. A fourth receiver 124 may receive a fourth clock signal QCLKB, the data DQ, and the reference voltage VREF, and output fourth data signals QBOUT and QBOUTB. The fourth receiver 124 may output a result of comparing the data DQ with the reference voltage VREF as the fourth data signals QBOUT and QBOUTB at the transition timing of the fourth clock signal QCLKB.

In FIG. 2, the deserializer 130 receives a serial data stream from each of four replicating receivers 121-124. The deserializer 130 converts each of those four, serial data streams that it receives from the replicating receivers 121-124, to four, corresponding streams of parallel data. Those four separate streams of parallel data output from the deserializer are identified in FIG. 2 as "DOUT."

The deserializer 130 may receive four serial data streams, namely, the first serial data signals IOUT and IOUTB, the second data signals QOUT and QOUTB, the third data signals IBOUT and IBOUTB, and the fourth data signals QBOUT and QBOUTB. The deserializer converts those serial data streams to four separate streams of parallel data bytes, which together comprise the output parallel data, DOUT. The deserializer 130 may parallelize the first data signals IOUT and IOUTB, the second data signals QOUT and QOUTB, the third data signals IBOUT and IBOUTB, and the fourth data signals QBOUT and QBOUTB, and output four, parallelized serial input signals as the parallel data DOUT.

The test circuit 200 may be activated during the test operation of the semiconductor apparatus 100. The test circuit 200 may include a plurality of replication receivers, (depicted in FIG. 3 and identified by reference numerals 201-1, 201-2, 201-3 and 201-4) having circuit configurations the same as the receivers 121 to 124 depicted in FIG. 2. The plurality of replication receivers of the test circuit 200, which are depicted in FIG. 3 and identified by reference numerals 201-1, 201-2, 201-3 and 201-4, are configured to generate a corresponding plurality of oscillation signals in response to a plurality of oscillation enable signals. The plurality of replication receivers 201-1, 201-2, 201-3 and 201-4 may be configured to generate the plurality of oscillation enable signals in response to a test enable signal TMEN and to generate a detection signal SDET in response to any one of the plurality of oscillation signals.

The plurality of replication receivers 201-1, 201-2, 201-3 and 201-4 of the test circuit 200 are components for detecting operating characteristics, i.e., the same properties of the plurality of receivers 121 to 124. Therefore, the replication receivers 201-1, 201-2, 201-3 and 201-4 preferably have the same, or at least substantially the same, operating characteristics, i.e., the same or substantially the same properties as the plurality of receivers 121 to 124. Since the circuits depicted in the figures are preferably fabricated on the same physical semiconductor substrate, the test circuit 200 is preferably located in an area of the semiconductor substrate having test circuit 200, which is adjacent to and preferably contiguous with, i.e., in direct contact with the area where the plurality of receivers 121 to 124 are located on the substrate.

FIG. 3 is a diagram illustrating the configuration of the test circuit 200 in accordance with an embodiment of the present disclosure.

Referring to FIG. 3, the test circuit 200 may include a plurality of replication receivers 201-1 to 201-4 and an oscillation control circuit 202.

The plurality of replication receivers 201-1 to 201-4 shown in FIG. 3, may have a circuitry configuration, which is the same as the circuitry configuration of the receivers comprising the plurality of receivers 121 to 124 shown in FIG. 2. The plurality of replication receivers 201-1 to 201-4 may be configured to generate a plurality of oscillation signal pairs OSC<1:4>/OSCB<1:4> in response to a first input signal IN1, a second input signal IN2, both of which are input to each replication receiver 201-1 to 201-4, and, an oscillation enable signal, ENB1, ENB2, ENB3 and ENB4 for each replication receiver 201-1 to 201-4.

Figure 4:
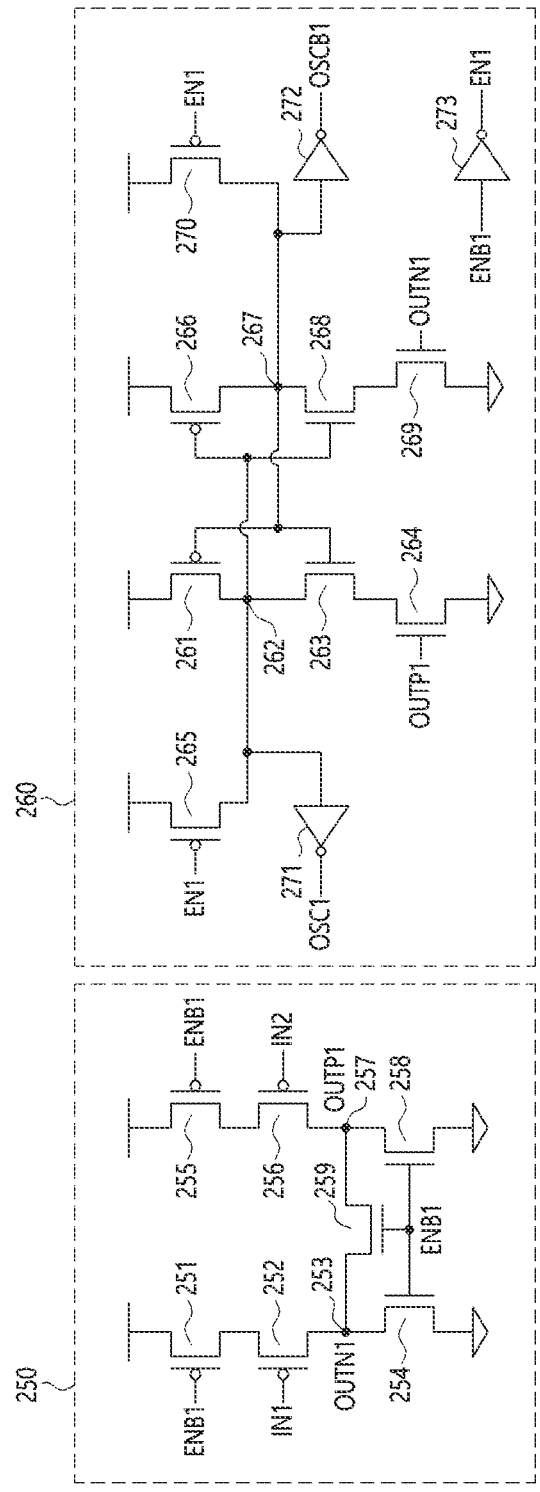
FIG. 4 is a diagram illustrating the configuration of a replication receiver in FIG. 3.

In FIG. 3, and as shown in FIG. 4, which depicts a replication receiver circuit exemplar, signals that make up an oscillation signal pair, i.e., OSC1 and OSCB1, OSC2 and OSCB2, OSC3 and OSCB2, and OSC4 and OSCB4, are digital and complementary, i.e., their respective magnitudes are equal (or substantially equal) and out of phase, or substantially out of phase, by 180 degrees.

The plurality of replication receivers 201-1 to 201-4 may generate the plurality of oscillation signal pairs OSC<1:4>/OSCB<1:4> by repeating precharge and level transition for the output terminals of the replication receivers in response to the oscillation enable signals ENB<1:4>, the first input signal IN1, and the second input signal IN2. One or both input signals, i.e., the first input signal IN1 and the second input signal IN2, may be provided from the outside of the semiconductor apparatus 100 during the test operation. The first input signal IN1 may be fixed at a first level and the second input signal IN2 may be fixed at a similar or different, second level. The first level and the second level are both adjustable.

A first replication receiver 201-1 may receive a first oscillation enable signal ENB1, the first input signal IN1, and the second input signal IN2, and output a pair of oscillation signals, i.e., a first oscillation signal pair OSC1/OSCB1 from corresponding inverters 271 and 272, the output terminals of which may be precharged a first, known-in-advance or "predetermined" logic level. Precharging an output terminal may occur in response to deactivation of the first oscillation enable signal ENB1, and when the first oscillation enable signal ENB1 is activated, whereby the first replication receiver 201-1 may transition any one of the first oscillation signal pair OSC1/OSCB1 to a second logic level in response to the first input signal IN1 and the second input signal IN2. As shown in FIG. 3, the first oscillation enable signal ENB1, is derived from the reset signal, RSTB, the test enable signal, TMEN and the set signal, SETB. The first logic level may be a low level and the second logic level may be a high level. The plurality of oscillation enable signals ENB<1:4> may be respectively deactivated and activated in the case of high and low levels.

The second replication receiver 201-2 may receive a second oscillation enable signal ENB2, the first input signal IN1, and the second input signal IN2, and output a second oscillation signal pair OSC2/OSCB2. As shown in FIG. 3, the second oscillation enable signal ENB2 is derived from signals output from the first replication receiver 201-1, namely, OSC1 and OSCB1. The second replication receiver 201-2 may precharge its own output terminals to the first logic level in response to deactivation of the second oscillation enable signal ENB2, and when the second oscillation enable signal ENB2 is activated, the second replication receiver 201-2 may transition any one of the second oscillation signal pair OSC2/OSCB2 to the second logic level in response to the first input signal IN1 and the second input signal IN2.

The third replication receiver 201-3 may receive a third oscillation enable signal ENB3, the first input signal IN1, and the second input signal IN2 and output a third oscillation signal pair OSC3/OSCB3. As shown in FIG. 3, the third oscillation enable signal ENB3 is derived from signals output from the second replication receiver 201-2, namely, OSC2 and OSCB2. The third replication receiver 201-3 may its own output terminals to the first logic level in response to deactivation of the third oscillation enable signal ENB3, and when the third oscillation enable signal ENB3 is activated, the third replication receiver 201-3 may transition any one of the third oscillation signal pair OSC3/OSCB3 to the second logic level in response to the first input signal IN1 and the second input signal IN2.

The fourth replication receiver 201-4 may receive a fourth oscillation enable signal ENB4, the first input signal IN1, and the second input signal IN2 and output a fourth oscillation signal pair OSC4/OSCB4. As shown in FIG. 3, the fourth oscillation enable signal ENB4 is derived from signals output from the third replication receiver 201-3, namely, OSC3 and OSCB3. The fourth replication receiver 201-4 may precharge its own output terminals to the first logic level in response to deactivation of the fourth oscillation enable signal ENB4, and when the fourth oscillation enable signal ENB4 is activated, the fourth replication receiver 201-4 may transition any one of the fourth oscillation signal pair OSC4/OSCB4 to the second logic level in response to the first input signal IN1 and the second input signal IN2.

The oscillation control circuit 202 may operate the plurality of replication receivers 201-1 to 201-4 as oscillators in response to activation of the test enable signal TMEN. The oscillation control circuit 202 may be configured to generate the plurality of oscillation enable signals ENB<1:4> in response to the test enable signal TMEN, and to generate the detection signal SDET in response to any one of the plurality of oscillation signal pairs OSC<1:4>/OSCB<1:4>.

The oscillation control circuit 202 may include an oscillation enable signal generation circuit 203, a reset signal generation circuit 204, a detection signal generation circuit 205, and a set signal generation circuit 206.

The oscillation enable signal generation circuit 203 may generate the plurality of oscillation enable signals ENB<1:4> in response to the test enable signal TMEN, a reset signal RSTB, a set signal SETB, and the plurality of oscillation signal pairs OSC<1:3>/OSCB<1:3>. The oscillation enable signal generation circuit 203 may include first to fourth signal generation logics 210, 220, 230, and 240.

The first signal generation logic 210 may generate the first oscillation enable signal ENB1 in response to the test enable signal TMEN, the reset signal RSTB, and the set signal SETB. The first signal generation logic 210 may include an SR latch composed of a plurality of logic gates 211 to 213. The first signal generation logic 210 may deactivate the first oscillation enable signal ENB1 to a high level when the test enable signal TMEN is deactivated to a low level, and activate the first oscillation enable signal ENB1 to a low level when the test enable signal TMEN is activated to a high level. The first signal generation logic 210 may deactivate the first oscillation enable signal ENB1 to a high level when the reset signal RSTB is activated to a low level, and activate the first oscillation enable signal ENB1 to a low level when the set signal SETB is activated to a low level.

The second signal generation logic 220 may output, as the second oscillation enable signal ENB2, a signal obtained by inverting a first NOR signal OC1 generated by performing a NOR operation on the first oscillation signal pair OSC1/OSCB1. The second signal generation logic 220 may include a first logic gate 221 and a second logic gate 222. The first logic gate 221 may output, as the first NOR signal OC1, a result of performing a NOR operation on the first oscillation signal pair OSC1/OSCB1. The second logic gate 222 may invert the first NOR signal OC1 and output the inverted result as the second oscillation enable signal ENB2.

The third signal generation logic 230 may output, as the third oscillation enable signal ENB3, a signal obtained by inverting a second NOR signal OC2 generated by performing a NOR operation on the second oscillation signal pair OSC2/OSCB2. The third signal generation logic 230 may include a first logic gate 231 and a second logic gate 232. The first logic gate 231 may output, as the second NOR signal OC2, a result of performing a NOR operation on the second oscillation signal pair OSC2/OSCB2. The second logic gate 232 may invert the second NOR signal OC2 and output the inverted result as the third oscillation enable signal ENB3.

The fourth signal generation logic 240 may output, as the fourth oscillation enable signal ENB4, a signal obtained by inverting a third NOR signal OC3 generated by performing a NOR operation on the third oscillation signal pair OSC3/OSCB3. The fourth signal generation logic 240 may include a first logic gate 241 and a second logic gate 242. The first logic gate 241 may output, as the third NOR signal OC3, a result of performing a NOR operation on the third oscillation signal pair OSC3/OSCB3. The second logic gate 242 may invert the third NOR signal OC3 and output the inverted result as the fourth oscillation enable signal ENB4.

The reset signal generation circuit 204 may generate the reset signal RSTB in response to any one of the plurality of oscillation signal pairs OSC<1:4>/OSCB<1:4>, for example, the first oscillation signal pair OSC1/OSCB1. The reset signal generation circuit 204 may output, as the reset signal RSTB, a pulse signal generated according to the first NOR signal OC1. The reset signal generation circuit 204 may include a pulse generator (PG) 204-1. The pulse generator 204-1 may output, as the reset signal RSTB, the pulse signal generated according to the first NOR signal OC1.

The detection signal generation circuit 205 may generate the detection signal SDET in response to another one of the plurality of oscillation signal pairs OSC<1:4>/OSCB<1:4>, for example, the second oscillation signal pair OSC2/OSCB2. The detection signal generation circuit 205 may output, as the detection signal SDET, a result of counting a pulse signal generated according to the second NOR signal OC2. The detection signal generation circuit 205 may include a pulse generator (PG) 205-1 and a counter 205-2. The pulse generator 205-1 may generate the pulse signal according to the second NOR signal OC2. The counter 205-2 may output, as the detection signal SDET, a result of counting the pulse signal generated by the pulse generator 205-1.

The set signal generation circuit 206 may generate the set signal SETB in response to further another one of the plurality of oscillation signal pairs OSC<1:4>/OSCB<1:4>, for example, the fourth oscillation signal pair OSC4/OSCB4. The set signal generation circuit 206 may generate a fourth NOR signal OC4 by performing a NOR operation on the fourth oscillation signal pair OSC4/OSCB4, and output, as the set signal SETB, a pulse signal generated according to the fourth NOR signal OC4. The set signal generation circuit 206 may include a logic gate 206-1 and a pulse generator (PG) 206-2. The logic gate 206-1 may generate the fourth NOR signal OC4 by performing a NOR operation on the fourth oscillation signal pair OSC4/OSCB4. The pulse generator 206-2 may output, as the set signal SETB, a pulse signal generated according to the fourth NOR signal OC4.

FIG. 4 is a diagram illustrating the configuration of the first replication receiver 201-1 in FIG. 3.

Referring to FIG. 4, the first replication receiver 201-1 may have a two-stage structure. A first stage 250 may include a plurality of transistors 251, 252, 254, 255, 258, and 259. A first transistor 251 may have a source terminal connected to a power supply terminal and a gate terminal through which the first oscillation enable signal ENB1 is received. A second transistor 252 may have a source terminal connected to a drain terminal of the first transistor 251, a gate terminal through which the first input signal IN1 is received, and a drain terminal connected to a first node 253 The first node 253, which is also the OUTN1 terminal, is considered herein to be an output terminal that is precharged. A first preliminary output signal OUTN1 may be generated through the first node 253. A third transistor 254 may have a source terminal connected to a ground terminal, a drain terminal connected to the first node 253, and a gate terminal through which the first oscillation enable signal ENB1 is received. A fourth transistor 255 may have a source terminal connected to the power supply terminal and a gate terminal through which the first oscillation enable signal ENB1 is received. A fifth transistor 256 may have a source terminal connected to a drain terminal of the fourth transistor 255, a gate terminal through which the second input signal IN2 is received, and a drain terminal connected to a second node 257. The second node 257, which is also the OUTP1 terminal, is considered herein to be an output terminal that is precharged. A second preliminary output signal OUTP1 may be generated through the second node 257. A sixth transistor 258 may have a source terminal connected to the ground terminal, a drain terminal connected to the second node 257, and a gate terminal through which the first oscillation enable signal ENB1 is received. A seventh transistor 259 may have a source terminal connected to the first node 253, a drain terminal connected to the second node 257, and a gate terminal through which the first oscillation enable signal ENB1 is received.

A second stage 260 may include a plurality of transistors 261, 263, 264, 265, 266, 268, 269, and 270 and a plurality of logic gates 271 to 273. A first transistor 261 may have a source terminal connected to the power supply terminal, a drain terminal connected to a first node 262, and a gate terminal connected to a second node 267. A second transistor 263 may have a drain terminal connected to the first node 262 and a gate terminal connected to the second node 267. A third transistor 264 may have a source terminal connected to the ground terminal, a drain terminal connected to a source terminal of the second transistor 263, and a gate terminal through which the second preliminary output signal OUTP1 is received. A fourth transistor 265 may have a source terminal connected to the power supply terminal, a drain terminal connected to the first node 262, and a gate terminal through which an inverted first oscillation enable signal EN1 is received. A fifth transistor 266 may have a source terminal connected to the power supply terminal, a drain terminal connected to the second node 267, and a gate terminal connected to the first node 262. A sixth transistor 268 may have a drain terminal connected to the second node 267 and a gate terminal connected to the first node 262. A seventh transistor 269 may have a source terminal connected to the ground terminal, a drain terminal connected to a source terminal of the sixth transistor 268, and a gate terminal through which the first preliminary output signal OUTN1 is received. An eighth transistor 270 may have a source terminal connected to the power supply terminal, a drain terminal connected to the second node 267, and a gate terminal through which the inverted first oscillation enable signal EN1 is received. A first logic gate 271 may invert a logic level of the first node 262 and output any one (for example, OSC1) of the first oscillation signal pair OSC1/OSCB1. A second logic gate 272 may invert a logic level of the second node 267 and output the other one (for example, OSCB1) of the first oscillation signal pair OSC1/OSCB1. A third logic gate 273 may generate the inverted first oscillation enable signal EN1 by inverting the first oscillation enable signal ENB1.

Figure 5:
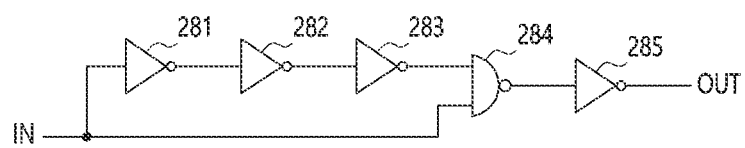
FIG. 5 is a diagram illustrating the configuration of a pulse generator in FIG. 3.

FIG. 5 is a diagram illustrating the configuration of the pulse generator 204-1 in FIG. 3.

Referring to FIG. 5, the pulse generator 204-1 may include a plurality of logic gates 281 to 285. First to third logic gates 281 to 283, each of which has some propagation delay, may sequentially delay and invert the input signal IN. A fourth logic gate 284 may perform a NAND operation on the output of the third logic gate 283 and the input signal IN and output the NAND operation result, each gate adding additional delay. A fifth logic gate 285 may generate an output signal OUT by inverting the output of the fourth logic gate 284. A pulse width of the output signal OUT may be adjusted according to signal delay of the odd logic gates, that is, the first to third logic gates 281 to 283.

Figure 6:
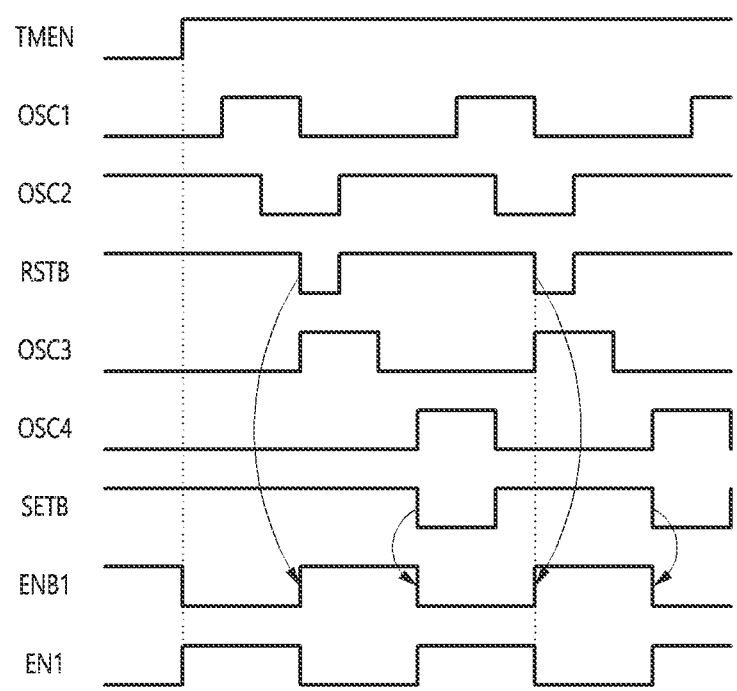
FIG. 6 is a timing diagram illustrating an operation of the test circuit in accordance with an embodiment of the present disclosure.

FIG. 6 is a timing diagram illustrating an operation of the test circuit 200 in accordance with an embodiment of the present disclosure.

The operation of the test circuit 200 in accordance with an embodiment of the present disclosure is described with reference to FIGS. 3 to 6.

When the test enable signal TMEN is deactivated to a low level, the first oscillation enable signal ENB1 is maintained at a high level and the inverted first oscillation enable signal EN1 is maintained at a low level.

Since the first oscillation enable signal ENB1 has a high level and the inverted first oscillation enable signal EN1 has a low level, the first preliminary output signal OUTN1, the second preliminary output signal OUTP1, and the first oscillation signal pair OSC1/OSCB1 are all precharged to a low level.

As the test enable signal TMEN is activated to a high level, the first oscillation enable signal ENB1 transitions to a low level and the inverted first oscillation enable signal EN1 transitions to a high level.

Since the first oscillation enable signal ENB1 has a low level and the inverted first oscillation enable signal EN1 has a high level, one of the first preliminary output signal OUTN1 and the second preliminary output signal OUTP1 transitions to a high level according to a level difference between the first input signal IN1 and the second input signal IN2, and thus one of the first oscillation signal pair OSC1/OSCB1, for example, OSC1, transitions to a high level.

As the first oscillation enable signal ENB1 transitions to a high level again according to the reset signal RSTB, the OSC1 may transition to a low level again.

The first oscillation signal pair OSC1/OSCB1 may oscillate according to the reset signal RSTB and the set signal SETB. The set signal SETB may be generated according to the fourth NOR signal OC4 obtained by combining the fourth oscillation signal pair OSC4/OSCB4.

The second to fourth oscillation enable signals EN<2:4>/ENB<2:4> repeat transitions in a predetermined order in response to the first to third oscillation signal pairs OSC<1:3>/OSCB<1:3>. As a consequence, the second to fourth oscillation signal pairs OSC<2:4>/OSCB<2:4> may also oscillate in response to the oscillation of the first oscillation signal pair OSC1/OSCB1.

A result of counting pulse signals according to the second NOR signal OC2 may be outputted as the detection signal SDET to the outside of the semiconductor apparatus 100. In such a case, using the second NOR signal OC2, that is, the second oscillation signal pair OSC2/OSCB2 in order to generate the detection signal SDET is only one example, and since all the first to fourth oscillation signal pairs OSC<1:4>/OSCB<1:4> show the same characteristics, any one of them may be used.

The detection signal SDET may include information on the operating characteristics, for example, signal delay characteristics of the plurality of receivers 121 to 124. Since the activation time of the test enable signal TMEN can be controlled by the outside of the semiconductor apparatus 100, the test time can be known. Consequently, the signal delay characteristics of the plurality of receivers 121 to 124 can be detected according to the detection signal SDET. The performance of the receiving circuit 110 can be improved through adjustment of the operating environment such as voltage adjustment matching the detected operating characteristics.

Figure 7:
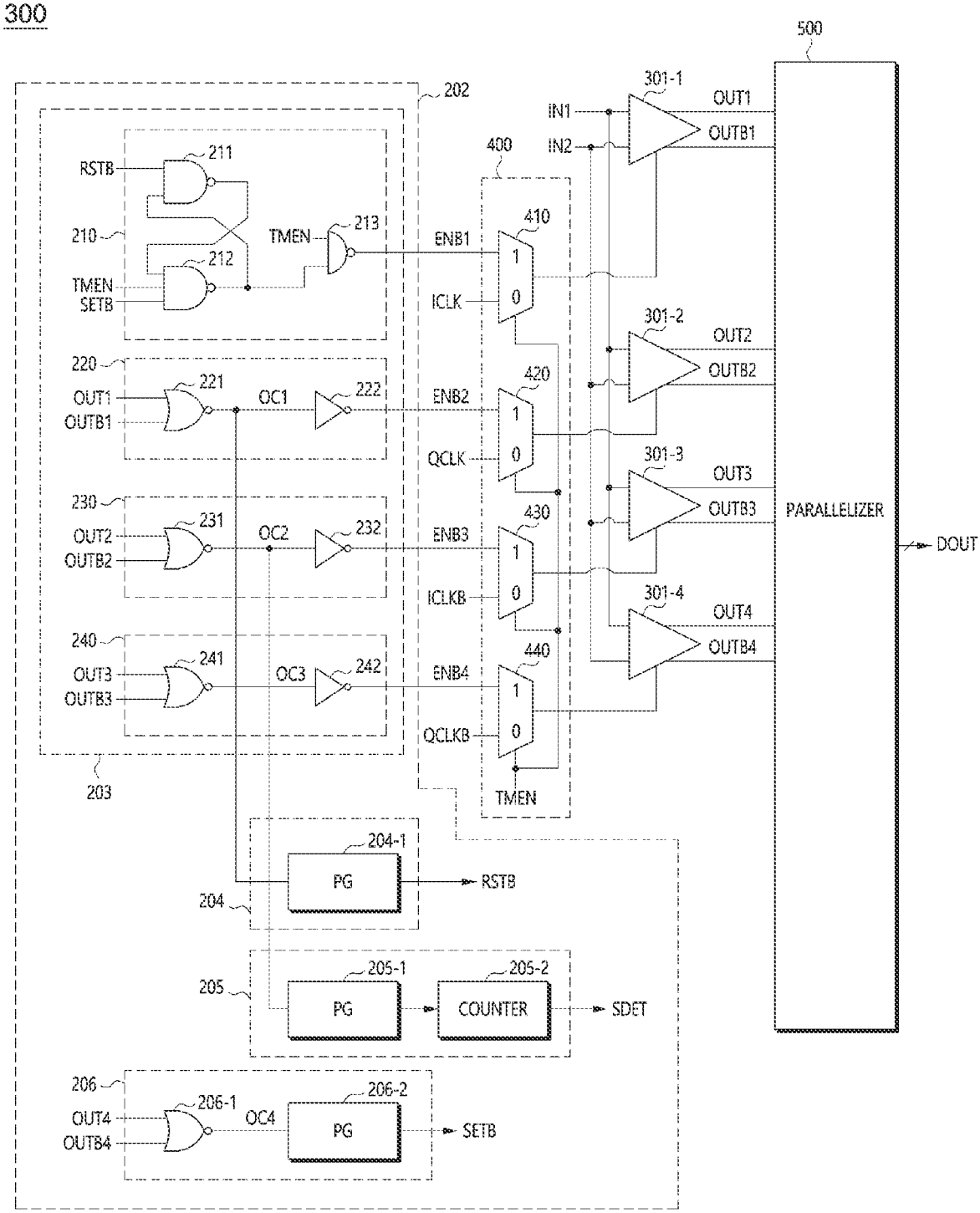
FIG. 7 is a diagram illustrating the configuration of a receiving circuit in accordance with another embodiment of the present disclosure.

FIG. 7 is a diagram illustrating the configuration of a receiving circuit identified by reference numeral 300 in accordance with another embodiment of the present disclosure.

The receiving circuit 300 may include a plurality of receivers, and allow the plurality of receivers to generate a plurality of output signals in response to a multiphase clock signal during a normal operation, to generate a plurality of oscillation signals in response to a plurality of oscillation enable signals during a test operation, and to generate a detection signal in response to any one of the plurality of oscillation signals.

Referring to FIG. 7, the receiving circuit 300 may include a plurality of receivers 301-1 to 301-4, a mode control circuit 400, and an oscillation control circuit 202. The receiving circuit 300 may further include a deserializer 500.

The plurality of receivers 301-1 to 301-4 may be configured to generate a plurality of output signals OUT<1:4>/OUTB<1:4> by amplifying a voltage level difference, i.e., amplifying the voltage difference between a first input signal IN1 and a second input signal IN2 at a particular time (timings) corresponding to when a clock signal is input to the receiver output from an associated multiplexer.

The plurality of receivers 301-1 to 301-4 may receive multiphase clock signals ICLK, QCLK, ICLKB, and QCLKB through the clock terminals thereof, respectively, the during normal operation of the semiconductor apparatus 100, receive data DQ as the first input signal IN1, and receive a reference voltage VREF as the second input signal IN2, and generate the plurality of output signals OUT<1:4>/OUTB<1:4>, respectively, that is, a plurality of data signals.

The plurality of receivers 301-1 to 301-4 may receive a plurality of oscillation enable signals ENB<1:4> through the clock terminals thereof, respectively, during a test operation of the semiconductor apparatus 100, receive the first input signal IN1 and the second input signal IN2 having a level difference therebetween adjustable for test, and generate the plurality of output signals OUT<1:4>/OUTB<1:4>, respectively, that is, a plurality of oscillation signals.

The plurality of receivers 301-1 to 301-4 may have the same configuration as the plurality of receivers 121 to 124 in FIG. 2. The plurality of receivers 301-1 to 301-4 may be configured identically to one another.

The mode control circuit 400 may be configured to selectively provide the clock terminals of the plurality of receivers 301-1 to 301-4 with the multiphase clock signals ICLK, QCLK, ICLKB, and QCLKB and the plurality of oscillation enable signals ENB<1:4> in response to a test enable signal TMEN. The mode control circuit 400 may include a plurality of multiplexers 410, 420, 430, and 440. A first multiplexer 410 may provide a first oscillation enable signal ENB1 to the clock terminal of a first receiver 301-1 when the test enable signal TMEN has a high level, and provide a first phase clock signal ICLK to the clock terminal of the first receiver 301-1 when the test enable signal TMEN has a low level. A second multiplexer 420 may provide a second oscillation enable signal ENB2 to the clock terminal of a second receiver 301-2 when the test enable signal TMEN has a high level, and provide a second phase clock signal QCLK to the clock terminal of the second receiver 301-2 when the test enable signal TMEN has a low level. A third multiplexer 430 may provide a third oscillation enable signal ENB3 to the clock terminal of a third receiver 301-3 when the test enable signal TMEN has a high level, and provide a third phase clock signal ICLKB to the clock terminal of the third receiver 301-3 when the test enable signal TMEN has a low level. A fourth multiplexer 440 may provide a fourth oscillation enable signal ENB4 to the clock terminal of a fourth receiver 301-4 when the test enable signal TMEN has a high level, and provide a fourth phase clock signal QCLKB to the clock terminal of the fourth receiver 301-4 when the test enable signal TMEN has a low level.

The oscillation control circuit 202 may be configured to generate the plurality of oscillation enable signals ENB<1:4> in response to the test enable signal TMEN and the plurality of output signals OUT<1:4>/OUTB<1:4>, and to generate a detection signal SDET in response to any one of the plurality of output signals OUT<1:4>/OUTB<1:4>.

Since the oscillation control circuit 202 may be configured in the same manner as in FIG. 3, a description of the configuration thereof is omitted.

The deserializer 500 may receive the plurality of output signals OUT<1:4>/OUTB<1:4> and output parallel data DOUT. The deserializer 500 may parallelize the plurality of output signals OUT<1:4>/OUTB<1:4> and output the parallelized signal as the parallel data DOUT.

An operation of the receiving circuit 300 is described below.

During the normal operation of the semiconductor apparatus 100, the test enable signal TMEN is deactivated to a low level.

Since the test enable signal TMEN has a low level, the plurality of multiplexers 410, 420, 430, and 440 provide the multiphase clock signals ICLK, QCLK, ICLKB, and QCLKB to the clock terminals of the plurality of receivers 301-1 to 301-4, respectively.

The plurality of receivers 301-1 to 301-4 receive the data DQ as the first input signal IN1, receive the reference voltage VREF as the second input signal IN2, and generate the plurality of output signals OUT<1:4>/OUTB<1:4>, that is, the plurality of data signals, respectively.

During the test operation of the semiconductor apparatus 100, the test enable signal TMEN is activated to a high level.

Since the test enable signal TMEN has a high level, the plurality of multiplexers 410, 420, 430, and 440 provide the plurality of oscillation enable signals ENB<1:4> to the clock terminals of the plurality of receivers 301-1 to 301-4, respectively.

The plurality of receivers 301-1 to 301-4 may receive the first input signal IN1 and the second input signal IN2 having a predetermined level difference therebetween and each having a fixed level, and generate the plurality of output signals OUT<1:4>/OUTB<1:4>, respectively, that is, the plurality of oscillation signals.

As the test enable signal TMEN is activated, the oscillation control circuit 202 may generate the plurality of oscillation enable signals ENB<1:4> in response to the plurality of output signals OUT<1:4>/OUTB<1:4>, and generate the detection signal SDET in response to any one of the plurality of output signals OUT<1:4>/OUTB<1:4>.

The detection signal SDET may be outputted to the outside of the semiconductor apparatus 100. The detection signal SDET may include information on the operating characteristics, for example, signal delay characteristics of the plurality of receivers 301-1 to 301-4. Since the activation time of the test enable signal TMEN can be controlled by the outside of the semiconductor apparatus 100, the test time can be known. Consequently, the signal delay characteristics of the plurality of receivers 301-1 to 301-4 can be detected according to the detection signal SDET. The performance of the receiving circuit 300 can be improved through adjustment of the operating environment such as voltage adjustment matching the detected operating characteristics.

A person skilled in the art to which the present disclosure pertains can understand that the present disclosure may be carried out in other specific forms without changing its technical spirit or essential features. Therefore, it should be understood that the embodiments described above are illustrative in all aspects, not limitative. The scope of the present disclosure is defined by the claims to be described below rather than the detailed description, and it should be construed that all changes or modified forms derived from the meaning and scope of the claims and the equivalent concept thereof are included in the scope of the present disclosure.

What is claimed is:
1. A test circuit comprising:
a plurality of replication receivers, each replication receiver configured to generate an oscillation signal pair, in response to an oscillation enable signal provided to said replication receiver; and
an oscillation control circuit configured to generate an oscillation enable for each replication receiver in response to a test enable signal, and, generate a detection signal in response to an oscillation signal pair.

2. The test circuit according to claim 1, wherein each replication receiver is configured to repeat precharge and level transition for output terminals of said replication receiver, in a predetermined order in response to said oscillation enable signal.

3. The test circuit according to claim 1, wherein the oscillation control circuit is configured to operate the replication receivers as oscillators in response to activation of the test enable signal.

4. The test circuit according to claim 1, wherein the oscillation control circuit comprises:
   an oscillation enable signal generation circuit configured to generate an oscillation enable signal in response to: the test enable signal, a reset signal, a set signal and, an oscillation signal pair;
   a reset signal generation circuit configured to generate the reset signal in response to a first oscillation signal pair;
   a detection signal generation circuit configured to generate the detection signal in response to a second oscillation signal pair; and
   a set signal generation circuit configured to generate the set signal in response to a third oscillation signal pair.

5. The test circuit according to claim 4, wherein the oscillation enable signal generation circuit comprises:
   an SR latch configured to generate a first oscillation enable signal in response to: the test enable signal, a reset signal and, a set signal; and
   a plurality of logic circuits configured to generate a second oscillation enable signal by logically combining oscillation signal pairs.

6. The test circuit according to claim 4, wherein the reset signal generation circuit comprises:
   a pulse generator configured to generate, as the reset signal, a pulse signal generated responsive to logically combining oscillation signal pairs.

7. The test circuit according to claim 4, wherein the detection signal generation circuit comprises:
   a pulse generator configured to generate a pulse signal in response to logically combining oscillation signal pairs; and
   a counter configured to output, the detection signal, responsive to a pulse signal count.

8. The test circuit according to claim 4, wherein the set signal generation circuit comprises:
   a pulse generator configured to generate, as the set signal, a pulse signal generated from oscillation signal pairs.

9. The test circuit according to claim 1, wherein the detection signal includes replication receiver signal-delay characteristics.

10. A receiving circuit comprising:
    a plurality of first receivers configured to receive data in response to multiphase clock signals; and
    a test circuit including a plurality of replication receivers configured to:
      replicate the plurality of first receivers;
      generate a plurality of oscillation signals in response to a plurality of oscillation enable signals;
      generate the plurality of enable oscillation signals in response to a test enable signal; and
      generate a detection signal in response to one of the plurality of oscillation signals.

11. The receiving circuit according to claim 10, wherein the test circuit comprises:
    an oscillation enable signal generation circuit configured to generate the plurality of oscillation enable signals in response to: the test enable signal, a reset signal, a set signal and, the plurality of oscillation signals;
    a reset signal generation circuit configured to generate the reset signal in response to a first one of the plurality of oscillation signals;
    a detection signal generation circuit configured to generate the detection signal by counting a second one of the plurality of oscillation signals; and
    a set signal generation circuit configured to generate the set signal in response to a third one of the plurality of oscillation signals.

12. The receiving circuit according to claim 10, wherein the detection signal includes information on signal delay characteristics of the plurality of replication receivers.

13. The receiving circuit according to claim 10, further comprising:
    a deserializer configured to parallelize outputs of the plurality of receivers and output the parallelized outputs.

14. A receiving circuit comprising:
    a plurality of receivers configured to generate a plurality of output signals by amplifying a voltage level difference between a first input terminal and a second input terminal, the voltage level difference being determined at time that are substantially synchronous to a clock signal provided to terminals of the plurality of receivers;
    a mode control circuit configured to selectively provide the clock terminals of the plurality of receivers with: multiphase clock signals and a plurality of oscillation enable signals, in response to a test enable signal; and
    an oscillation control circuit configured to generate the plurality of oscillation enable signals in response to the test enable signal and the plurality of output signals, and to generate a detection signal in response to any one of the plurality of output signals.

15. The receiving circuit according to claim 14, wherein the test enable signal is deactivated during a normal operation of the receiving circuit and is activated during a test operation of the receiving circuit.

16. The receiving circuit according to claim 14, wherein the plurality of receivers are configured to output a plurality of data signals in response to the multiphase clock signals during a normal operation, and to output a plurality of oscillation signals in response to the plurality of oscillation enable signals during a test operation.

17. The receiving circuit according to claim 14, wherein the mode control circuit comprises:
    a plurality of multiplexers each multiplexer being configured to:
      receive one of the multiphase clock signals corresponding to each of the plurality of multiplexers through a first input terminal;
      receive one of the plurality of oscillation enable signals corresponding to each of the plurality of multiplexers through a second input terminal;
      provide the signal of the first input terminal and the signal of the second input terminal to the clock terminals of the plurality of receivers according to the test enable signal.

18. The receiving circuit according to claim 14, wherein the oscillation control circuit comprises:
    an oscillation enable signal generation circuit configured to generate the plurality of oscillation enable signals in response to:
      the test enable signal, a reset signal, a set signal, and the plurality of oscillation signals; and a reset signal generation circuit configured to generate the reset signal in response to any one of the plurality of oscillation signals;
a detection signal generation circuit configured to generate the detection signal by counting another one of the plurality of oscillation signals; and
a set signal generation circuit configured to generate the set signal in response to further another one of the plurality of oscillation signals.

19. The receiving circuit according to claim 14, wherein the detection signal includes information on signal delay characteristics of the plurality of receivers.

20. The receiving circuit according to claim 14, further comprising:
a deserializer configured to parallelize outputs of the plurality of receivers and output the parallelized outputs.

* * * * *